United States Patent
So et al.

(10) Patent No.: US 10,483,325 B2
(45) Date of Patent: Nov. 19, 2019

(54) LIGHT EMITTING PHOTOTRANSISTOR

(71) Applicants: University Of Florida Research Foundation, Incorporated, Gainesville, FL (US); Nanoholdings, LLC, Rowayton, CT (US)

(72) Inventors: Franky So, Cary, NC (US); Do Young Kim, Jenks, OK (US); Hyeonggeun Yu, Raleigh, NC (US); Bhabendra K. Pradhan, Marietta, GA (US)

(73) Assignees: University of Florida Research Foundation, Incorporated, Gainesville, FL (US); Nanoholdings, LLC, Rowayton, CT (US)

( * ) Notice: Subject to any disclaimer, the term of this patent is extended or adjusted under 35 U.S.C. 154(b) by 0 days.

(21) Appl. No.: 15/758,928

(22) PCT Filed: Sep. 9, 2016

(86) PCT No.: PCT/US2016/051039
§ 371 (c)(1),
(2) Date: Mar. 9, 2018

(87) PCT Pub. No.: WO2017/044805
PCT Pub. Date: Mar. 16, 2017

(65) Prior Publication Data
US 2019/0043925 A1 Feb. 7, 2019

Related U.S. Application Data

(60) Provisional application No. 62/217,576, filed on Sep. 11, 2015.

(51) Int. Cl.
*H01L 27/28* (2006.01)
*H01L 51/00* (2006.01)
(Continued)

(52) U.S. Cl.
CPC ........ *H01L 27/288* (2013.01); *H01L 51/0021* (2013.01); *H01L 51/0046* (2013.01);
(Continued)

(58) Field of Classification Search
None
See application file for complete search history.

(56) References Cited

U.S. PATENT DOCUMENTS

| 6,037,718 A * | 3/2000 | Nagami ............. H01L 27/3262 315/169.3 |
| 7,261,852 B2 | 8/2007 | Rinzler et al. |

(Continued)

FOREIGN PATENT DOCUMENTS

| CN | 102629665 A1 | 8/2012 |
| WO | WO 2014/085410 A1 | 6/2014 |

(Continued)

OTHER PUBLICATIONS

U.S. Appl. No. 15/758,925, filed Mar. 9, 2018, Yu et al.
(Continued)

*Primary Examiner* — Benjamin P Sandvik
(74) *Attorney, Agent, or Firm* — Wolf, Greenfield & Sacks, P.C.

(57) ABSTRACT

A photonic conversion device is provided, comprising a photoactive layer, a dielectric layer, a porous conductor layer, and an electron transport layer in contact with the porous conductor layer. A light emitting device may be in contact with the electron transport layer, forming a conversion device with gain. A method of manufacturing a photonic conversion device may also be provided, comprising forming a photoactive layer, forming a dielectric layer over the photoactive layer, and depositing a conductor layer in contact with the dielectric layer, wherein one or more regions of the dielectric layer are masked during deposition (Continued)

such that the conductor layer includes a plurality of pores that extend through the conductor layer.

25 Claims, 11 Drawing Sheets

(51) Int. Cl.
  *H01L 51/42*  (2006.01)
  *H01L 51/44*  (2006.01)

(52) U.S. Cl.
  CPC ........ *H01L 51/4206* (2013.01); *H01L 51/442* (2013.01); *Y02E 10/549* (2013.01); *Y02P 70/521* (2015.11)

(56) References Cited

U.S. PATENT DOCUMENTS

| | | | |
|---|---|---|---|
| 7,776,444 | B2 | 8/2010 | Rinzler et al. |
| 7,972,699 | B2 | 7/2011 | Rinzler et al. |
| 8,232,561 | B2 | 7/2012 | Rinzler et al. |
| 8,759,830 | B2 | 6/2014 | Tessler et al. |
| 9,214,644 | B2 | 12/2015 | Rinzler et al. |
| 10,033,946 | B2 * | 7/2018 | Sarusi ................. H01L 27/3227 |
| 2004/0197546 | A1 | 10/2004 | Rinzler et al. |
| 2005/0199894 | A1 | 9/2005 | Rinzler et al. |
| 2005/0218412 | A1 | 10/2005 | Kido et al. |
| 2006/0099448 | A1 | 5/2006 | Lu et al. |
| 2007/0141345 | A1 | 6/2007 | Rinzler et al. |
| 2008/0268248 | A1 | 10/2008 | Jang et al. |
| 2009/0302310 | A1 | 12/2009 | Rinzler et al. |
| 2010/0237336 | A1 | 9/2010 | Rinzler et al. |
| 2010/0272981 | A1 | 10/2010 | Rinzler et al. |
| 2011/0232731 | A1 | 9/2011 | Namkoong et al. |
| 2012/0097949 | A1 | 4/2012 | Tessler et al. |
| 2012/0211749 | A1 | 8/2012 | Fukuoka et al. |
| 2012/0305061 | A1 | 12/2012 | O'Brien et al. |
| 2013/0215496 | A1 * | 8/2013 | Ban ...................... H01L 27/3227 359/345 |
| 2013/0240842 | A1 | 9/2013 | Rinzler et al. |
| 2014/0111652 | A1 | 4/2014 | So et al. |
| 2014/0263945 | A1 | 9/2014 | Huang et al. |
| 2015/0008390 | A1 * | 1/2015 | Lewis ..................... H01L 31/12 257/13 |
| 2015/0021621 | A1 | 1/2015 | Adekore et al. |
| 2015/0171149 | A1 | 6/2015 | So et al. |
| 2018/0254419 | A1 | 9/2018 | Yu et al. |

FOREIGN PATENT DOCUMENTS

| | | |
|---|---|---|
| WO | WO 2014/085410 A8 | 7/2014 |
| WO | WO 2015/066213 A1 | 5/2015 |

OTHER PUBLICATIONS

PCT/US2016/051039, dated Oct. 26, 2016, Invitation to Pay Additional Fees.
PCT/US2016/051039, dated Jan. 6, 2017, International Search Report and Written Opinion.
PCT/US2016/051039, dated Mar. 22, 2018, International Preliminary Report on Patentability.
PCT/US2016/051034, dated Oct. 26, 2016, Invitation to Pay Additional Fees.
PCT/US2016/051034, dated Jan. 26, 2017 International Search Report and Written Opinion.
PCT/US2016/051034, dated Mar. 22, 2018, International Preliminary Report on Patentability.
Invitation to Pay Additional Fees for International Application No. PCT/US2016/051039 dated Oct. 26, 2016.
International Search Report and Written Opinion for International Application No. PCT/US2016/051039 dated Jan. 6, 2017.
International Preliminary Report on Patentability for International Application No. PCT/US2016/051039 dated Mar. 22, 2018.
Invitation to Pay Additional Fees for International Application No. PCT/US2016/051034 dated Oct. 26, 2016.
International Search Report and Written Opinion for International Application No. PCT/US2016/051034 dated Jan. 26, 2017.
International Preliminary Report on Patentability for International Application No. PCT/US2016/051034 dated Mar. 22, 2018.
Extended European Search Report for European Application No. 16845154.0 dated Apr. 4, 2019.
Liu et al., Carbon-Nanotube-Enabled Vertical Field Effect and Light-Emitting Transistors. Advanced Materials. 2008;20(19):3605-9. doi: 10.1002/adma.200800601.

* cited by examiner (a)

(b)

(c)

LIGHT EMITTING PHOTOTRANSISTOR

CROSS-REFERENCE TO RELATED APPLICATIONS

This application is a National Phase Entry of international PCT patent application No. PCT/US2016/051039, entitled "LIGHT EMITTING PHOTOTRANSISTOR" filed on Sep. 9, 2016, which claims priority to and the benefit of U.S. Provisional Application Ser. No. 62/217,576, entitled "LIGHT EMITTING PHOTOTRANSISTOR" filed on Sep. 11, 2015. The entire contents of these applications are incorporated herein by reference in their entirety.

BACKGROUND

Infrared (IR)-to-visible up-conversion devices have been a subject of research interest because of their applications for pixelless imaging. Various types of IR photodetectors such as inorganic compound semiconductor photodetectors, organic photodetectors, and colloidal quantum dot (CQD) photodetectors have been used to fabricate up-conversion devices. However, the resulting external quantum efficiencies of the up-conversion devices are low (e.g., less than 10% efficiency in converting IR photons to visible photons).

SUMMARY

Some aspects provide a photonic conversion device, comprising a photoactive layer, a porous conductor layer, an electron transport layer in contact with the porous conductor layer, and a light emitting device in contact with the electron transport layer.

Further aspects provide a method of manufacturing a photonic conversion device, the method comprising forming a photoactive layer, forming a dielectric layer over the photoactive layer, and depositing a conductor layer in contact with the dielectric layer, wherein one or more regions of the dielectric layer are masked during deposition such that the conductor layer includes a plurality of pores that extend through the conductor layer.

Further aspects provide a method of operating a photonic conversion device comprising a photoactive layer, a porous conductor layer, an electron transport layer in contact with the porous conductor layer, and a light emitting device in contact with the electron transport layer, the method comprising applying a first bias voltage from the porous conductor layer across the photoactive layer, applying a second bias voltage from the porous conductor layer across the electron transport layer and the light emitting device, the second bias voltage having a sign opposite to a sign of the first bias voltage, wherein infrared photons incident on the photoactive layer produce visible photons from the light emitting device with a conversion efficiency exceeding 1000%.

The foregoing is a non-limiting summary of the invention, which is defined by the attached claims.

DETAILED DESCRIPTION

Figure 1:
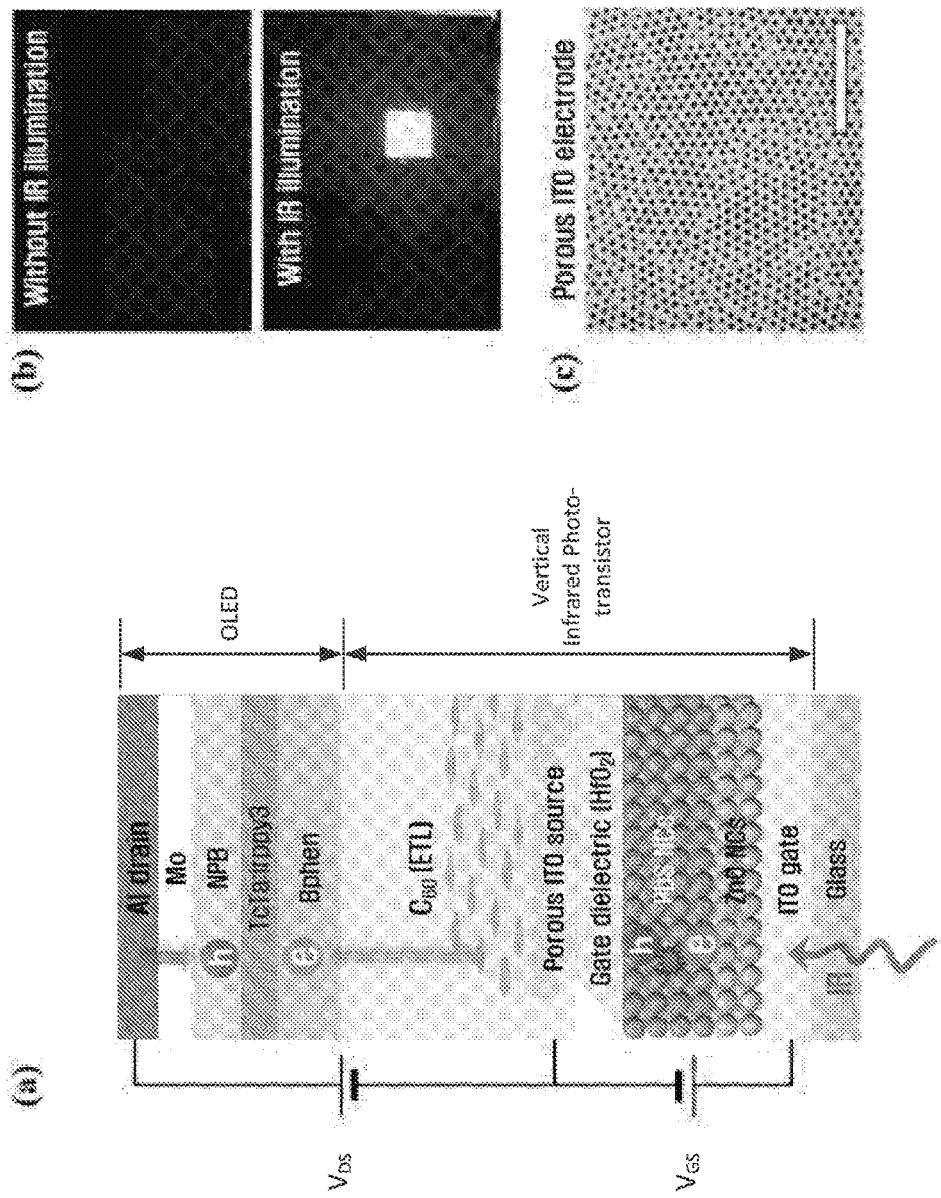
FIG. 1(a) is a schematic diagram of an illustrative light emitting phototransistor (LEPT) up-conversion device, according to some embodiments.
FIG. 1(b) illustrates an LEPT device as shown in FIG. 1(a) in a state in which it is emitting light.
FIG. 1(c) depicts pores of an illustrative porous ITO electrode of the LEPT device shown in FIG. 1(a)

Embodiments of the present invention are directed to a photonic conversion device comprising a high gain photodetector. Embodiments may be preferably directed to Infrared (IR)-to-visible up-conversion. The inventors have recognized and appreciated that by combining a photoactive layer, a dielectric layer and a porous conductive layer, a high photocurrent gain may be produced as a result of charge accumulation at the interface between the photoactive layer and the dielectric layer, thereby leading to injection of electrons from the porous conductive layer at high gain. In some embodiments, the photocurrent may be generated from electrons injected from the porous conductive layer into an electron transport layer adjacent to the conductive layer. The porous conductive layer may be adjacent to the dielectric layer, which may in turn be adjacent to the photoactive layer.

Without a bias applied to the photoactive layer and dielectric layer, there may be a Schottky barrier (or other potential energy barrier) at the interface between the porous conductive layer and the electron transport layer sufficiently high to substantially block electron injection into the electron transport layer. When a bias is applied across the photoactive layer, dielectric layer and porous conductive layer, electrons may accumulate at the interface between the dielectric and electron transport layers (i.e., in the region of the pores of the conductive layer). This may reduce the Schottky barrier at the interface between the porous conductive layer and the electron transport layer to some degree, yet the field effect may be small due to the presence of the dielectric layer and the dielectric properties of the photoactive layer.

When, however, the photoactive layer is illuminated with photons, and a bias is applied across the photoactive layer, dielectric layer and porous conductive layer, holes generated in the photoactive layer may accumulate at the interface between the photoactive layer and the dielectric layer. The accumulation of holes may, via the field effect, reduce the potential energy barrier in the region of the pores of the conductive layer such that electrons are readily injected from the conductive layer into the electron transport layer. In effect, the pores are used to modulate the injection of electrons from the porous conductive layer into the electron transport layer by providing regions having lower Schottky barrier heights due to the field effect of the accumulated holes. According to some embodiments, a phototransistor as discussed herein may have a photon to electron gain of between 1000% and 10,000%, or between 10,000% and 100,000%, or between 100,000% and 1,000,000%.

The inventors have recognized and appreciated that such a phototransistor may provide a high photon to electron gain with a fast dynamic response. While some infrared organic or colloidal quantum dot (CQD) photodetectors have reported acceptable photon to electron gains, such gains are due to charge trapping which have an inherently slow dynamic response. In contrast, the phototransistor described herein may produce a high photon to electron gain as a result of a capacitive gating effect, which produces a faster dynamic response. Furthermore, according to some embodiments, conventional lithography processes may be used to produce the phototransistor described herein, allowing the device to be fabricated using well-understood techniques. A phototransistor as described herein may be used in any suitable device that emits light, including but not limited to, display, imaging arrays (including infra-red imaging devices, such as night vision goggles), etc.

According to some embodiments, an electron transport layer as discussed above may be coupled to a light emitting device, such as an organic light emitting device (OLED). Electrons injected into the electron transport layer may combine with holes in an electroluminescent material of the light emitting device, thereby producing visible light. It should be appreciated, however, that the electroluminescent material may emit photons of any suitable spectral range, when electrons are injected. This spectral range may be higher or lower than the spectral range to which the photoactive layer responds, such that the device may provide frequency translation as well as gain.

The resulting light emitting phototransistor (LEPT) device therefore combines a phototransistor and a light emitting device. The high photon to electron gain described above may combine with the electron to photon gain produced by the light emitting device to produce a net IR photon to visible photon gain. According to some embodiments, a light-emitting phototransistor as discussed herein may have a net IR photon to visible photon gain of 1,000% or greater (e.g., a photon-to-electron gain of 100,000% and an electron-to-photon gain of 0.01%).

Figure 11:
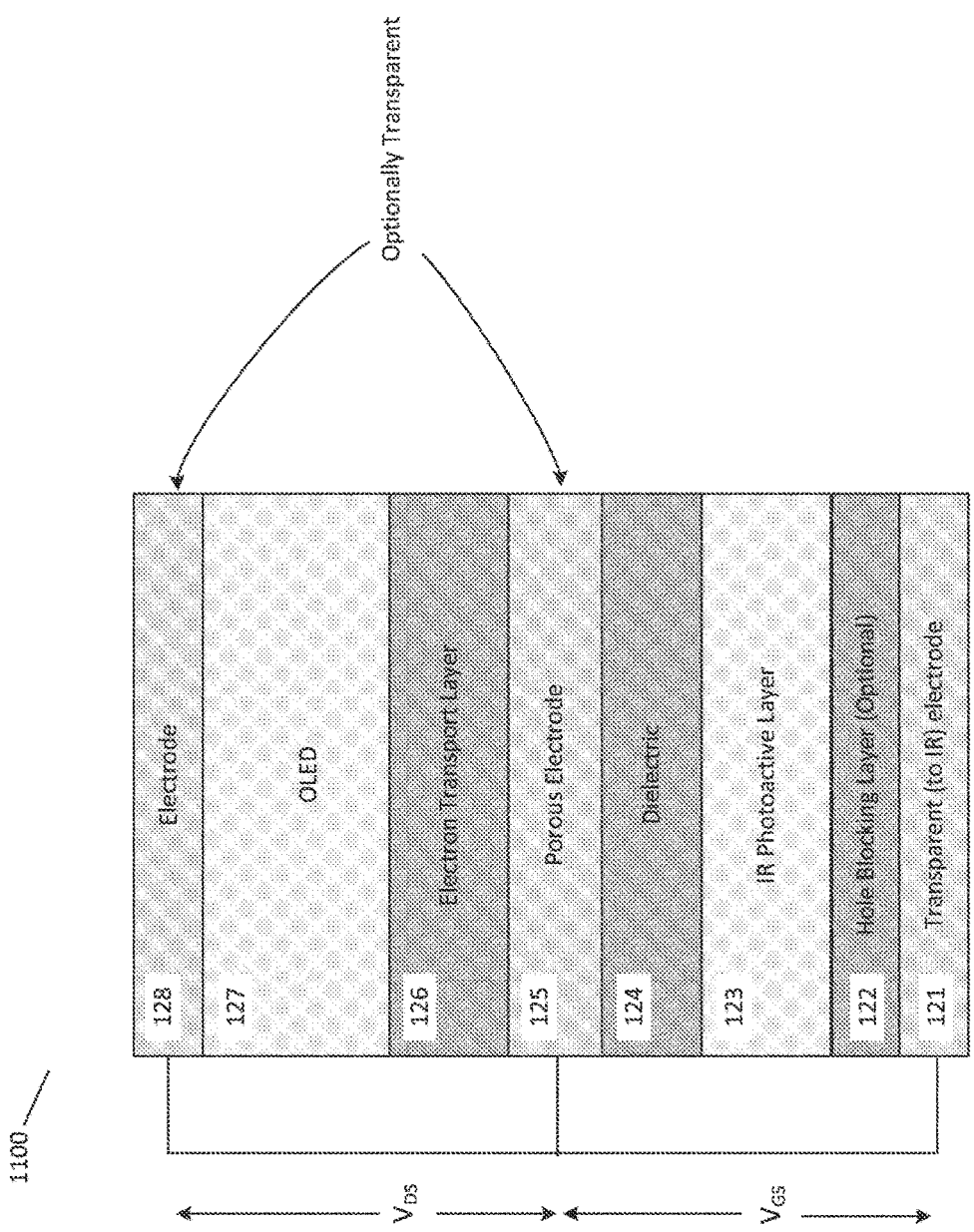
FIG. 11 is a schematic diagram of an illustrative light emitting phototransistor device, according to some embodiments.

FIG. 11 is a schematic diagram of an illustrative light emitting phototransistor (LEPT) device 1100, according to some embodiments. In this example, the photoactive layer is sensitive to photons in the IR spectrum and the electroluminescent material emits photons in the visible light spectrum. The device includes an infrared (IR) photoactive layer 123 on which IR photons may be incident after passing through a transparent electrode 121. The IR photons give rise to electron injection from the porous electrode 125 into the electron transport layer 126 (via a process to be described below). While electrode 125 is described as being "porous," this generally refers to a solid layer including intentionally created openings (such as, but not limited to pores or holes) that allow injection of electrons as described herein.

The electrons produce light in the OLED device 127, which escapes from the LEPT device by propagating through electrode 128 (if it is transparent to visible light) and/or through porous electrode 125 and transparent electrode 121 (if they are transparent to visible light). During operation, there is a bias voltage $V_{GS}$ applied from the porous electrode 125 to the transparent electrode 121, and a bias voltage $V_{DS}$ applied from the porous electrode 125 to the electrode 128. The sign of each bias voltage may be the same, or the bias voltages may have a different sign (e.g., both electrodes 121 and 128 may be at a lower potential than electrode 125, or may both be at a higher potential).

FIG. 1(a) is a schematic diagram of an illustrative LEPT up-conversion device, according to some embodiments, consisting of a phosphorescent organic light-emitting diode (OLED) and vertical infrared phototransistor. In the example of FIG. 1(a), colloidal PbS nanocrystals are used as a photoactive layer, and a porous ITO layer is used as the source electrode of the phototransistor.

FIG. 1(b) includes photographs of the device with and without infrared illumination (~940 nm). FIG. 1(c) is a Scanning Electron Microscope (SEM) image of an exemplary porous ITO film (~45 nm thickness), which includes a plurality of pores that extend through the source electrode (e.g., ITO) layer. In the example of FIG. 1(c), the pore diameters are around 0.8 μm, and the scale bar represents 10 μm. According to some embodiments, pore diameters may each be between 0.1 μm and 10 μm, such as between 0.5 μm and 2 μm. It will be appreciated that, while the diameter of each pore may each be within this range, the pores may exhibit a range of diameters in the source conductor layer. According to some embodiments, the average pore diameter is between 0.1 μm and 10 μm, such as between 0.5 μm and 2 μm. The fraction of the surface area of the source conductor layer in which a pore is present may in some embodiments be between 40% and 60%, such as around 50%.

FIG. 1(a) represents a schematic diagram of an illustrative LEPT design. Unlike conventional two-terminal up-conversion devices where photogenerated carriers in the photodetector are directly injected into the OLED, the illustrated LEPT is a three-terminal vertical phototransistor having an IR photo-active gate integrated with an OLED. With this configuration, the current through the OLED can be moderated by the applied gate voltage $V_{GS}$. In the example of FIG. 1(a), the photoactive gate consists of a solution-processed quantum-dot (PbS) layer inserted as an IR sensitizing gate between the ITO gate electrode and the $HfO_2$ gate dielectric layer. During operation, IR photons impinging upon the PbS layer through the ITO gate electrode generate photo-carriers, inducing a strong field-effect in the region where an electron transport layer (ETL) formed from $C_{60}$ is in contact with the porous ITO source electrode and the $HfO_2$ gate dielectric layer, modulating electron injection from the ITO source electrode to the $C_{60}$ channel layer, and resulting in light emission from the device. FIG. 1(b) shows the photographs of a LEPT with and without IR illumination during operation. Under IR illumination, substantially uniform light emission is observed over the active area of the device. Any suitable electron transport material may be used in the LEPT device, and $C_{60}$ is one such material that exhibits a desirably high electron mobility and provides a suitable energy barrier at the interface with the ITO source layer. According to some embodiments, the energy barrier at the interface with the ITO source layer is between 0.2 eV and 1 eV, such as between 0.4 eV and 0.8 eV, such as 0.6 eV.

FIG. 1(c) shows a scanning electron microscopy image of an illustrative porous ITO film with a nominal 800 nm pore size fabricated by colloidal nanolithography. The porous source electrode modulates electron injection into the OLED by the applied gate bias and the incident photons.

FIGS. 2(a)-2(f) illustrate the schematic band diagrams to explain the underlying mechanism of the vertical IR phototransistor shown in FIG. 1. Under zero gate bias (but with a non-zero drain source-bias) and no IR illumination (FIG. 2a), electron injection from the porous ITO source electrode to the $C_{60}$ channel layer is blocked due to the large electron injection barrier at the interface. The black dash line represents the lowest unoccupied molecular orbital (LUMO) level of the $C_{60}$ layer at the center of a pore (which is marked ★) where $C_{60}$ is directly contacted with the $HfO_2$ gate dielectric layer.

Figure 2:
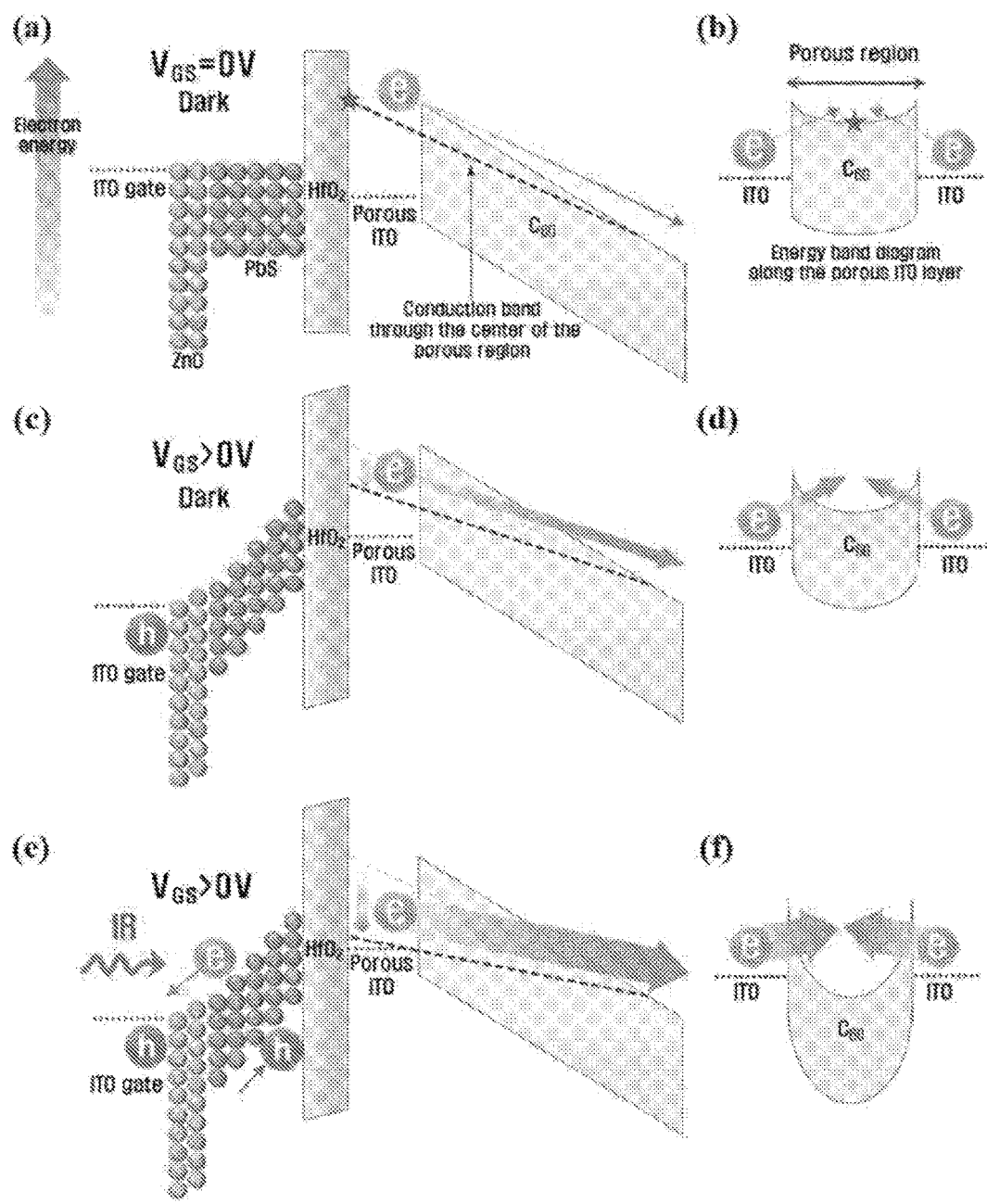
FIGS. 2(a)-2(f) illustrate schematic band diagrams explaining the underlying theory of the vertical IR phototransistor shown in FIG. 1(a), according to some embodiments.

FIG. 2(b) illustrates the lateral band diagram of the porous ITO/$C_{60}$ junction in the lateral direction. Since, as shown in FIG. 1(a), a reverse source-drain bias is applied to the ITO/$C_{60}$ Schottky junction, the dark current is low under zero gate bias. Under a positive gate bias with no IR illumination, as shown in FIG. 2(c), the solution-processed ZnO nanocrystal (NC) hole blocking layer with a deep ionization potential (=7.6 eV) blocks the injection of holes from the ITO gate electrode while attracting electrons to the $HfO_2$/$C_{60}$ interface in the porous ITO region. As a result of electron accumulation, band bending of the $C_{60}$ layer occurs where it is in contact with the porous ITO source electrode and the $HfO_2$ dielectric layer. Subsequently, the Schottky barrier width of the lateral ITO/$C_{60}$ interface is reduced, as shown in FIG. 2(d). However, the field-effect is not strong because of the thick gate dielectric stack (e.g., ZnO+PbS+$HfO_2$), and hence the increase in dark current is very small. In some embodiments, the dielectric stack may have a thickness of between 100 nm and 500 nm, between 200 nm and 400 nm, between 250 nm and 350 nm, or approximately 310 nm. In some embodiments, a photoactive layer (e.g., the PbS layer in the illustrative LEPT device shown in FIG. 1) may have a thickness between 60 nm and 240 nm, such as between 100 nm and 150 nm, such as 120 nm.

FIG. 2(e) illustrates the photocurrent gain mechanism which is an important part of the operation. Under a positive gate bias with IR illumination, the photo-generated holes in the PbS layer are accumulated at the PbS/$HfO_2$ interface while the photo-generated electrons in the PbS layer are transported through the ZnO layer to the ITO gate electrode. The accumulated holes at the PbS/$HfO_2$ interface significantly increase the field-effect due to an extremely thin effective gate dielectric layer (50 nm, $HfO_2$) compared to the effective thick gate dielectric stack (ZnO+PbS+$HfO_2$) when the device is operated in the dark. This strong field-effect results in strong band bending of the $C_{60}$ layer, thus leading to a significant narrowing of the lateral ITO/$C_{60}$ Schottky barrier width and electron injection at the porous ITO/$C_{60}$ interface, and hence a high photocurrent gain in the device.

EXAMPLE

In accordance with some embodiments, FIGS. 3(a)-3(f) and FIGS. 4(a)-4(c) depict properties of an illustrative phototransistor. The description below of these figures, including discussion of properties of this illustrative phototransistor are provided as an example and are not limiting with respect to the characteristics of a phototransistor as described above.

Figure 3:
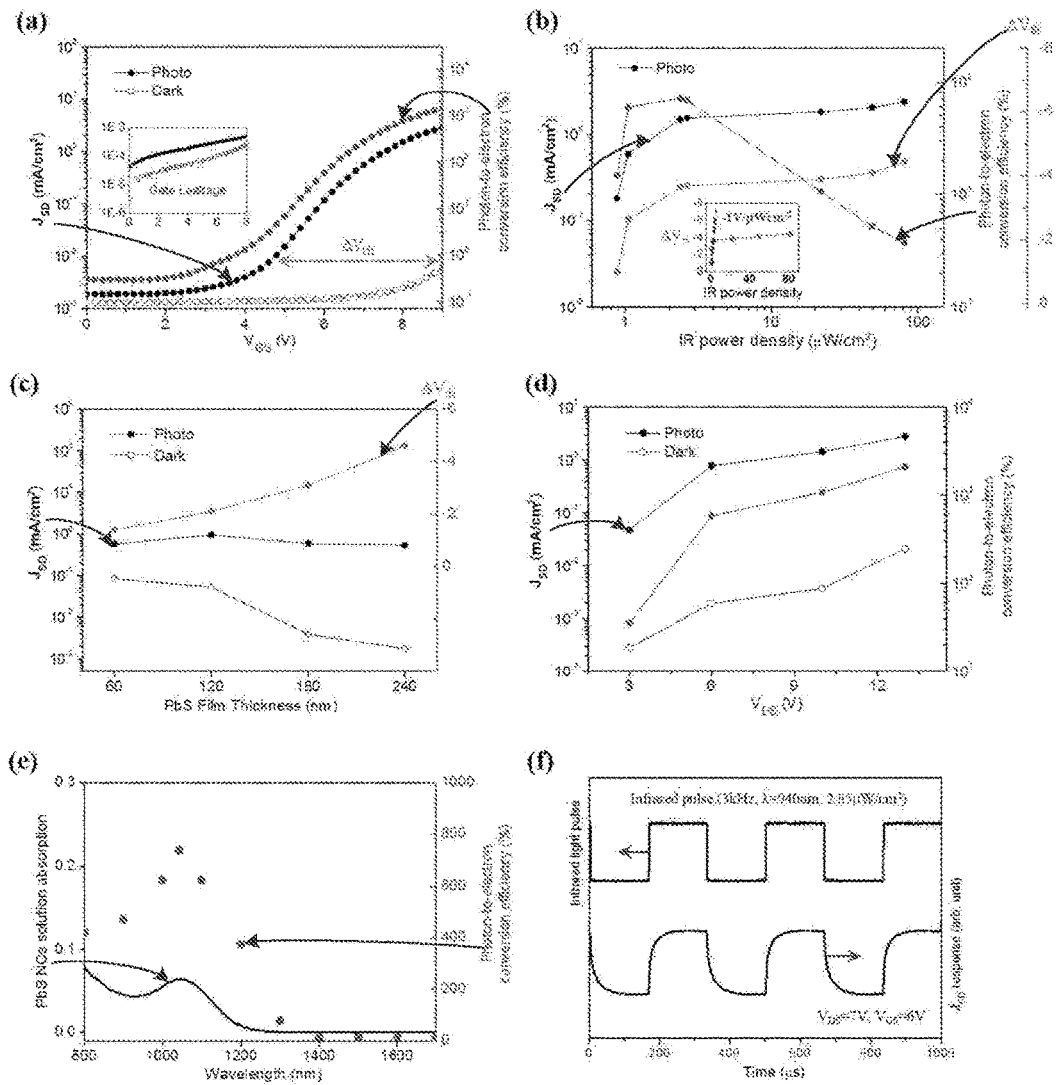
FIGS. 3(a)-3(f) depict device characteristics of an illustrative phototransistor, according to some embodiments.

FIGS. 3(a)-3(f) depict device characteristics of the illustrative phototransistor. FIG. 3(a) depicts a transfer curve with (filled circles labeled with $J_{SD}$ axis) and without (open circles) IR illumination ($\lambda$=1,042 nm, 240 μW/cm²) at $V_{DS}$=3 V. The curve of filled circles labeled with "Photon-to-electron conversion efficiency (%)" shows the photon-to-electron (p-to-e) external quantum efficiency (%). The inset is the gate leakage current.

FIG. 3(b) depicts the effect of IR power density on photo-current, $\Delta V_{th}$, and p-to-e efficiency at $V_{GS}$=5.4 V and $V_{DS}$=13 V. The inset reveals the linear scale IR power dependence of $\Delta V_{th}$. FIG. 3(c) depicts the effect of PbS thickness on photo current, dark current, and $\Delta V_{th}$ at $V_{GS}$=7 V and $V_{DS}$=3 V. IR light ($\lambda$=1,042 nm, 240 μW/cm²). FIG. 3(d) depicts the effect of $V_{DS}$ on photo current, dark current, and p-to-e efficiency at $V_{GS}$=6 V. IR light ($\lambda$=1,042 nm, 157 μW/cm²). FIG. 3(e) depicts the P-to-e efficiency spectrum under IR illumination (240 μW/cm²) at $V_{GS}$=8 V and $V_{DS}$=1 V. Black curve shows the absorbance spectrum of PbS precursor solution where the peak wavelength lies at 1,042 nm. FIG. 3(f) depicts a dynamic response of the phototransistor at $V_{GS}$=6 V and $V_{DS}$=7 V.

FIG. 3(a) depicts illustrative transfer curves of the phototransistor described herein. As discussed above, the photocurrent gain mechanism may be understood in terms of the electron injection modulation at the lateral ITO/$C_{60}$ interface. The injection modulation gain mechanism due to the enhanced field-effect by the photo-generated holes accumulated at the PbS/$HfO_2$ interface can be further interpreted by a shift in the threshold voltage ($\Delta V_{th}$) of the photo-transfer curve relative to the dark transfer curve. The dark current density (black open circle) remains at nearly $10^{-3}$ mA/cm² below the turn-on voltage of 8 V. Under IR illumination ($\lambda$=1,042 nm, power density=240 μW/cm²), the transfer curve is shifted by about −4 V. As a result, a high photo-to-dark current ratio of ~$10^3$ is obtained at $V_{GS}$=8 V and $V_{DS}$=3 V, reaching a photon-to-electron (p-to-e) conversion efficiency over $10^3$%. According to some embodiments, the gate leakage effect may be neglected because the leakage current is almost four orders of magnitude smaller than the photocurrent at $V_{GS}$=8 V as shown in the inset of FIG. 3a.

According to some embodiments, the threshold voltage shift under IR illumination can be explained by a parallel capacitor model as follows. Under IR illumination, the total potential drop ($q\Delta V_{total}$) across the $HfO_2$ layer comes from the capacitive coupling of the photo-generated holes ($q\Delta V_{photo}$) at the PbS/$HfO_2$ interface and the holes at the ITO gate electrode ($q\Delta V_{gate}$).

$$q\Delta V_{total} = q\Delta V_{photo} + q\Delta V_{gate} \quad (1)$$

Then, $\Delta V_{photo}$ is simply related with the dielectric capacitance of $HfO_2$ ($C_{HfO_2}$) and the coulombic charge of the photo-generated holes ($\Delta Q_{photo}$) by, $$\Delta V_{photo} = \frac{\Delta Q_{photo}}{C_{HfO_2}} = \frac{d}{\varepsilon_0 \varepsilon_r A} \Delta Q_{photo} \quad (2)$$

where d is the thickness of the $HfO_2$ layer, $\varepsilon_0$ is the vacuum permittivity, $\varepsilon_r$ is the relative permittivity of $HfO_2$, and A is the device area. The threshold voltage shift ($\Delta V_{th}$) observed in the transfer curve is the amount of voltage necessary to compensate $\Delta V_{photo}$. Hence, $\Delta Q_{photo}$ is proportional to the incident IR power density ($P_{IR,incident}$):

$$\Delta Q_{photo} = \frac{P_{IR,incident} \lambda}{hc} \times \eta \times \tau_{photo}, \quad (3)$$

where $\lambda$ is the wavelength of incident photons, h is the Planck's constant, c is the speed of light, $\eta$ is the number of the photo-generated carriers per incident IR photon in the PbS film, and $\tau_{photo}$ is the lifetime of photo-generated holes. Given that h, c, λ, η, and $\tau_{photo}$ are constant, the incident IR power density is proportional to $\Delta Q_{photo}$, and hence to $\Delta V_{photo}$. Since $\Delta V_{photo}$ is the same as $\Delta V_{th}$, the incident IR power density is proportional to $\Delta V_{th}$:

$$P_{IR,incident} \propto \Delta V_{th} \qquad (4)$$

Figure 6:
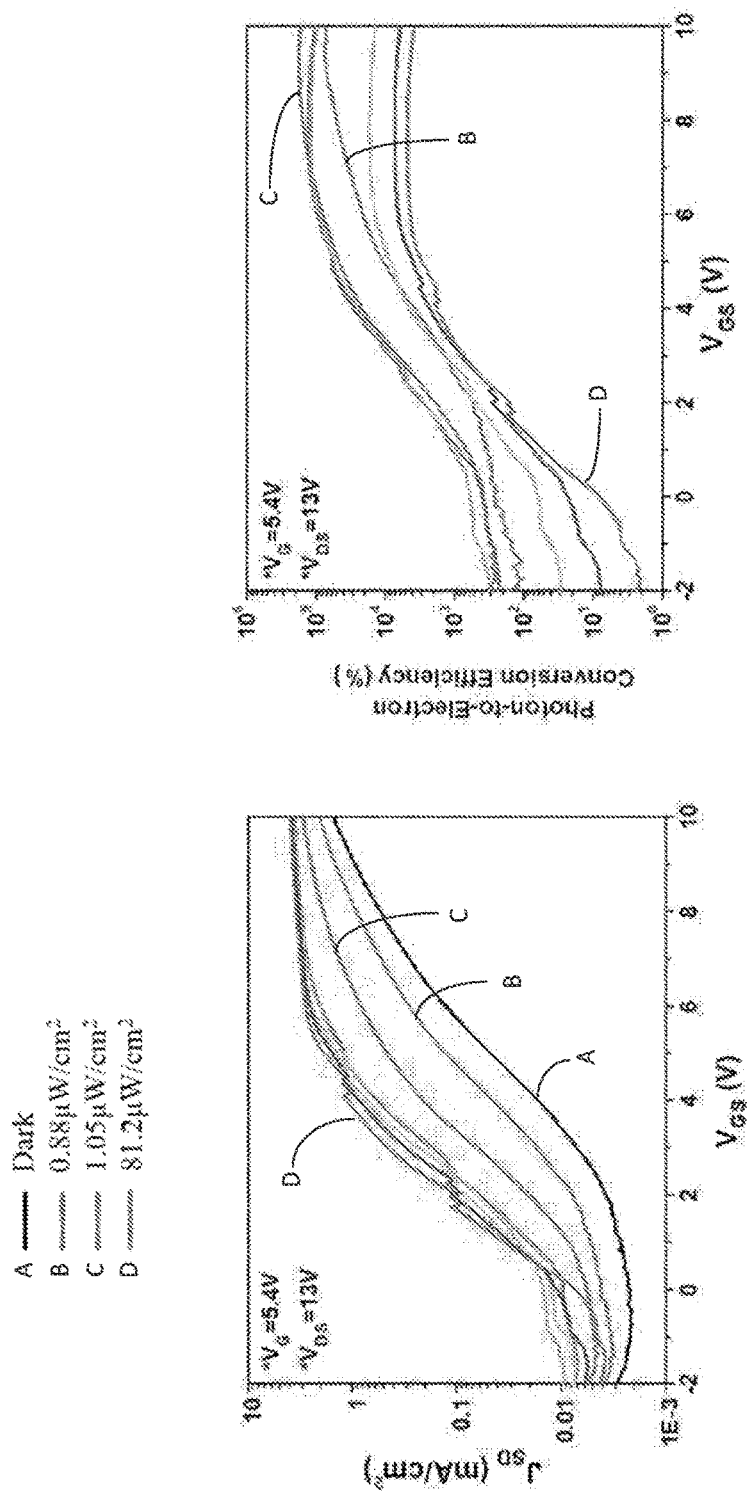
FIG. 6 illustrates current and photon-to-electron conversion efficiency of a vertical phototransistor as a function of gate bias, according to some embodiments.

FIG. 3(b) shows the IR power dependence of the photocurrent, external quantum efficiency (EQE), and $\Delta V_{th}$ of the phototransistor at $V_{GS}$=5.4 V and $V_{DS}$=13 V (data shown in FIG. 6). Note that $\Delta V_{th}$ is negative because the threshold voltage decreases upon IR illumination. The inset is the linear scale IR power dependence of $\Delta V_{th}$ where the linearity is observed below an IR power density of 2.7 μW/cm². The slope, which is the ratio of $\Delta V_{th}$ to IR power density, is determined to be about −1 V/μWcm⁻². At low IR power densities, the p-to-e conversion efficiency (or EQE) reaches nearly 10⁵% at an IR power density of 2.4 μW/cm², leading to a high detectivity of 1.23×10¹³ Jones measured at $V_{GS}$=3.5 V and $V_{DS}$=13 V. The details of the detectivity measurements are described below. At IR power densities over 2.7 μW/cm² the photocurrent and $\Delta V_{th}$ are saturated, leading to a decrease of EQE to 10³%. The saturated photo-response at higher IR power densities is due to space-charge-limited current (SCLC) in the $C_{60}$ channel. At low IR power densities, an increase of the photo-generated carriers in the PbS layer reduces the Schottky barrier width at the porous ITO/$C_{60}$ channel interface, increasing electron injection at the interface. At high IR power densities over 2.7 μW/cm², on the other hand, the Schottky barrier width is sufficiently narrow to facilitate ohmic injection of electrons from the porous ITO electrode to the $C_{60}$ layer, leading to the photocurrent saturation due to space charge effect in the channel layer at a fixed value of $V_{DS}$. Further increase in IR power density would not increase the photocurrent in the channel layer, resulting in saturation of $\Delta V_{th}$.

FIG. 3(c) depicts illustrative photocurrent, dark current, and $\Delta V_{th}$ as a function of the PbS film thickness at $V_{DS}$=3 V and $V_{GS}$=7 V. As observed in the figure, an increase in the PbS film thickness decreases the dark current by two orders of magnitude due to a smaller gate capacitance (See FIG. 7). In some embodiments, a LEPT may include a photosensitive layer (e.g., PbS) having a thickness of between 60 nm and 240 nm, such as between 100 nm and 220 nm, or between 140 nm and 200 nm.

Figure 7:
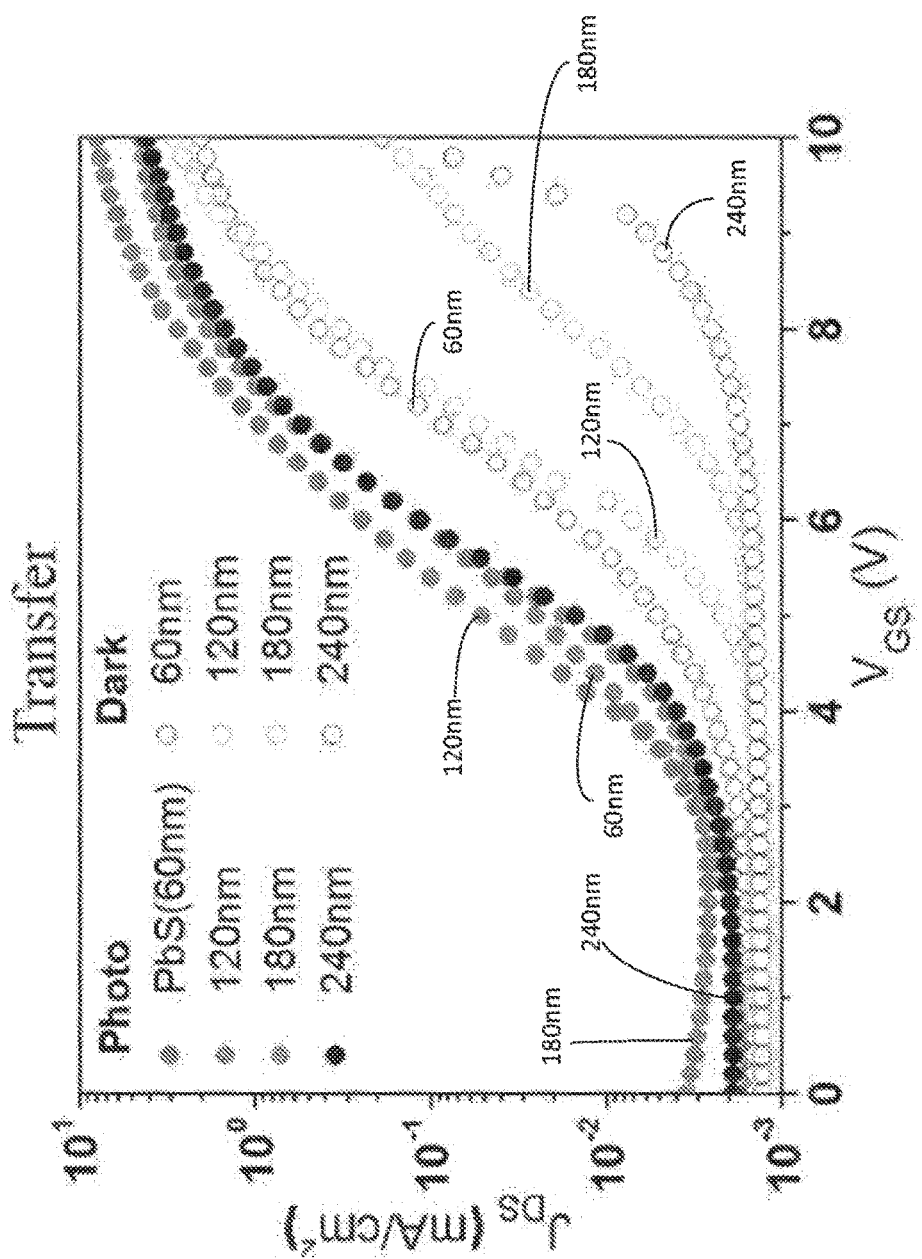
FIG. 7 depicts the effect of PbS thickness on device operation window, according to some embodiments.

Increasing the PbS film thickness also increases the light absorption and hence the photo-carrier density in the PbS film. From Equation (2), a higher $\Delta Q_{photo}$ increases the value of |$\Delta V_{th}$|, which is observed from a gradual increase of its value from 1.4 V to 4.6 V as shown in the FIG. 3(c). It should be noted, however, that the photocurrent is not significantly affected by the PbS film thickness. As explained in the previous section, the photocurrent is space-charge-limited in the $C_{60}$ channel and further increase in photo-carrier concentration in the PbS layer due to an increase in film thickness does not lead to an increase in photocurrent. It should be also noted that the choice of the PbS film thickness is important to define the device operation window. As illustrated in FIG. 7, a larger PbS film thickness leads to a larger |$\Delta V_{th}$| allowing for a broader device operating window. However, if the PbS film becomes thicker than the IR penetration depth (400~500 nm), $\Delta Q_{photo}$ is saturated, leading to a saturation of |$\Delta V_{th}$| with a significant increase of the operation voltage.

Figure 8:
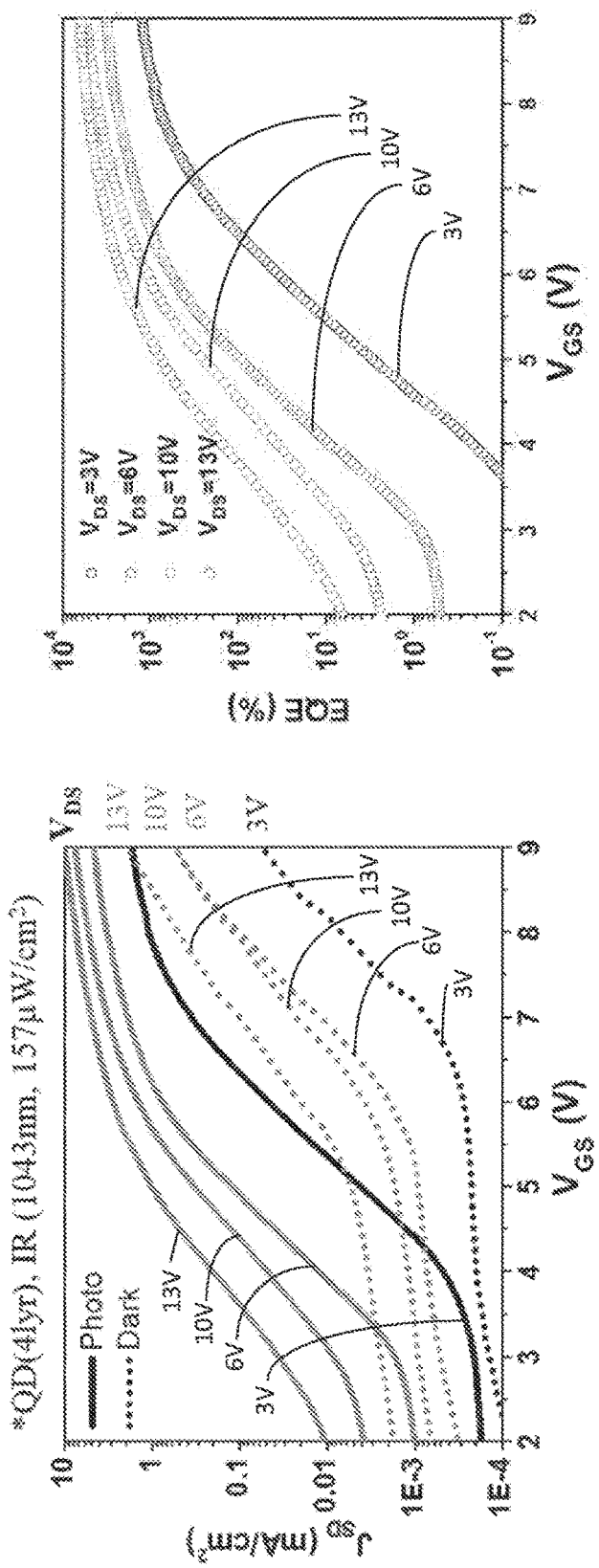
FIG. 8 illustrates the effect of $V_{DS}$ on external quantum efficiency (EQE), according to some embodiments.

One interesting feature of this type of phototransistor is that its EQE can be manipulated by the source-drain voltage ($V_{DS}$). FIG. 3(d) shows the photocurrent, dark current, and EQE as a function of $V_{DS}$. As the source-drain voltage increases from 3 V to 12 V, the p-to-e conversion efficiency increases from 35% to 2,100% due to the increased photocurrent. The dark current also rises with the photocurrent due to the increased reverse bias at the ITO/$C_{60}$ Schottky junction (FIG. 8). According to some embodiments, a LEPT as described herein may be operated with a source-drain voltage between 7V and 15V, between 8V and 13V, between 9V and 12V or between 10V and 11V.

FIG. 3(e) shows the EQE spectrum of the phototransistor under IR illumination (240 μW/cm²) at $V_{GS}$=8 V and $V_{DS}$=1 V. It should be noted that the EQE spectrum is in agreement qualitatively with the precursor absorption spectrum observed with an absorption maximum at 1,040 nm.

High gain photodetectors reported previously have shown slow dynamic responses because the gains come from charge-trapping in the photo-active layer. Since the gain mechanism of a phototransistor as described herein may is due to gating, is the inventors expect that the dynamic response is significantly faster than the gain devices based on charge-trapping. The speed of the device were measured under pulsed IR illumination (3 kHz, λ=940 nm, 2.85 μW/cm²) at constant bias conditions ($V_{DS}$=7 V and $V_{GS}$=6 V) as shown in FIG. 3(f). In the example of FIG. 3(f), the cut-off frequency of the gain phototransistor is 20 kHz which is an almost 1,000-fold enhancement relative to the values of high gain CQD photodetectors reported previously in the literature. The speed of a phototransistor as described herein may be limited by the resistance (R) of the $C_{60}$ channel layer as well as the total capacitance (C) of the device, which were measured to be 6,024Ω and 1.6 nF, respectively. The corresponding RC constant is 9.6 μs leading to a cut-off frequency of 17 kHz, which is in good agreement with the measured cut-off frequency of 20 kHz. In some embodiments, a LEPT and/or a phototransistor as described herein may have a cut-off frequency of between 10 kHz and 30 kHz, between 12 kHz and 25 kHz, between 15 kHz and 20 kHz, or approximately 17 kHz.

We fabricated a light-emitting phototransistor by incorporating an OLED in the phototransistor channel. To realize a LEPT, a phosphorescent OLED consisting of a stack of MoOx (hole injection layer)/NPB (hole transporting layer)/TCTA:Ir(ppy)₃ (emission layer)/Bphen (electron transporting layer) was inserted between the Al drain electrode and the $C_{60}$ channel layer in the phototransistor.

Figure 4:
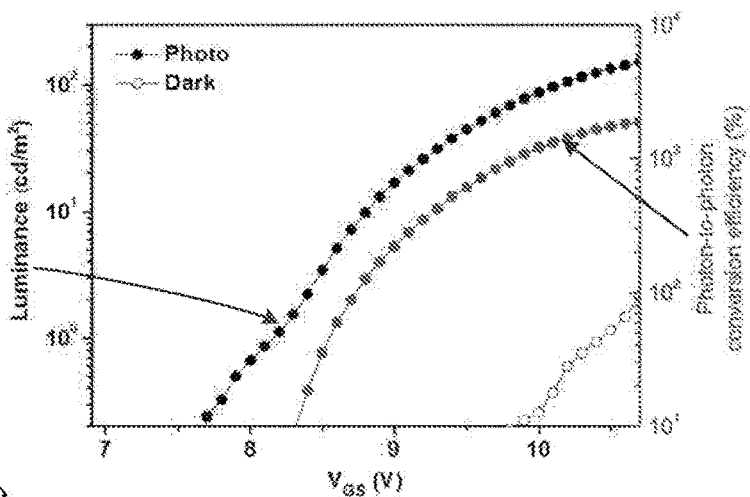
FIGS. 4(a)-4(c) illustrate device characteristics of a LEPT, according to some embodiments.
Figure 4:
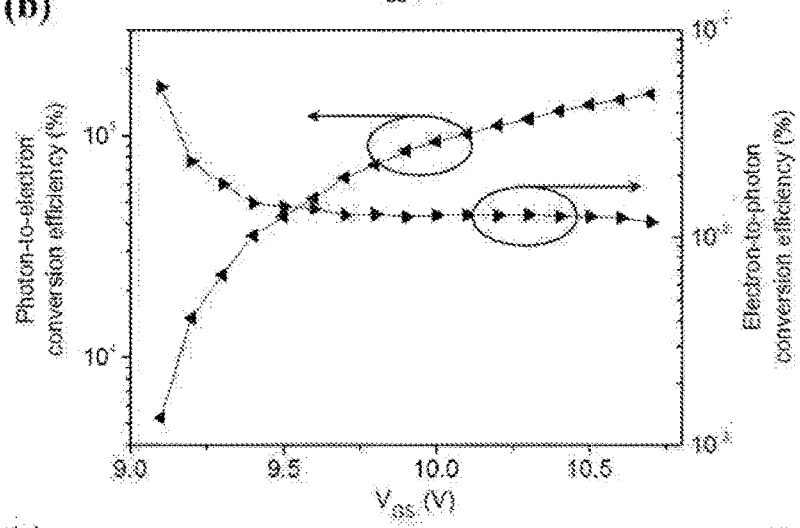
Figure 4:
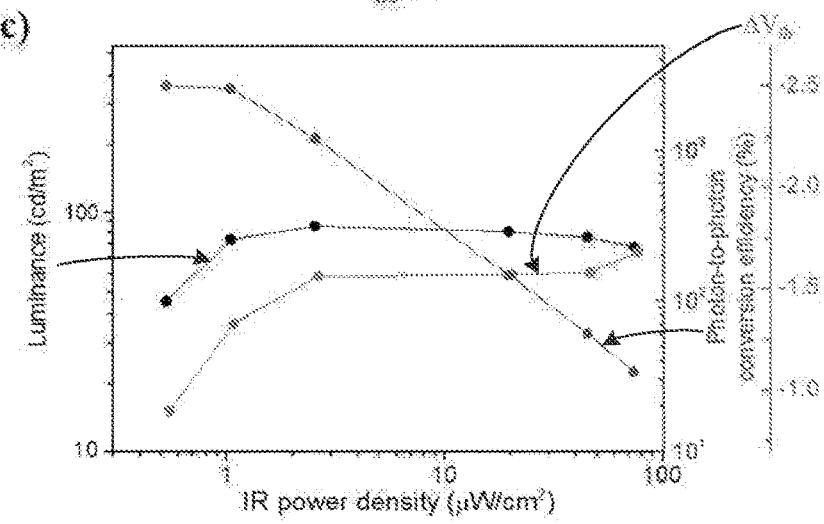

FIGS. 4(a)-4(c) illustrate device characteristics of the illustrative LEPT. FIG. 4(a) depicts a luminance transfer curve with (filled circles labeled with "Luminance") and without (open circles) IR illumination (λ=1,043 nm, 2.54 μW/cm²) at $V_{DS}$=15 V. The filled curve labeled "Photon-to-photon conversion efficiency" shows the photon-to-photon (p-to-p) external quantum efficiency (EQE) reaching over 1,000% at $V_{DS}$=10 V. FIG. 4(b) depicts P-to-e efficiency and e-to-p efficiency curves in the active operating region of the LEPT in FIG. 4(a). FIG. 4(c) depicts IR power dependence of luminance (filled circles labeled "Luminance"), $\Delta V_{th}$ (filled circles labeled "$\Delta V_{th}$"), as well as p-to-p efficiency (filled circles labeled "Photon-to-photon conversion efficiency") at $V_{GS}$=10 V and $V_{DS}$=15 V.

According to some embodiments, a LEPT as described herein may be operated with a gate-source voltage between 7V and 15V, between 8V and 13V, between 9V and 12V or between 10V and 11V. According to some embodiments, a LEPT as described herein may have a photon-to-electron conversion efficiency of between 10,000% and 200,000%, or between 12,000% and 100,000%, or between 15,000% and 80,000%. According to some embodiments, a LEPT as described herein may have an electron-to-photon conversion efficiency of between 0.01% and 20%, or between 0.05% and 10%, or between 0.1% and 5%.

FIG. 4(a) shows the luminance transfer curve of a LEPT at $V_{DS}$=15 V. In spite of the fixed high $V_{DS}$, the dark luminance (black open, representing luminance without IR illumination) is low (<1 cd/m$^2$) over the entire operating range ($V_{GS}$<10.4 V) due to the suppressed electron injection from the phototransistor. The luminance transfer curve is shifted under IR illumination as explained in the previous section, resulting in a luminance on/off ratio of 10$^3$ at a $V_{GS}$ of 10 V. Due to the high sensitivity of the phototransistor, a low IR illumination ($\lambda$=1,043 nm, 2.54 µW/cm$^2$) level results in a high up-conversion photon-to-photon (p-to-p) conversion efficiency of 1,000% at a $V_{GS}$ of 10 V. This is almost a 1000-fold enhancement compared to our previously reported infrared-to-visible up-conversion efficiency. It should also be noted that the turn-on voltage of the up-conversion luminance in the LEPT is 7.5 V, which is 2 V higher than that of the phototransistor (FIG. 3(a)) due to the additional turn-on voltage of the OLED in the device.

The high p-to-p conversion efficiency stems from the significant increase of the p-to-e conversion efficiency compared to the efficiency of the photodetectors used in conventional up-conversion devices. FIG. 4(b) shows the p-to-e conversion efficiency as well as the e-to-p conversion efficiency in the active region of FIG. 4(a). As shown, the p-to-e conversion efficiency reaches 10$^5$% at a $V_{GS}$ of 10 V and this efficiency is almost the same as the efficiency of the stand-alone phototransistor, which is more than four orders of magnitude higher than the p-to-e conversion efficiency of the reported up-conversion devices. The significant enhancement of the efficiency is due to the gain mechanism of the phototransistor.

Compared to the high p-to-e conversion efficiency, the e-to-p conversion efficiency is only 0.01%. This e-to-p conversion efficiency may be attributed to the high charge-imbalance in the OLED in the LEPT. The high charge-imbalance is due to an extremely thick electron transport layer (1 µm-thick $C_{60}$ and 50 nm-thick Bphen) compared with the hole transport layer (100 nm thick NPB). In the present embodiment, the electron transport layer is formed suitably thick to ensure that none of the ITO source layer protrude through the electron transport layer and cause shorts to occur. Using manufacturing techniques with a lower likelihood of ITO protruding (and/or reduce the distance of such protrusions) into the electron transport layer, the electron transport layer could be manufactured as a thinner layer, which would improve the electron to photon gain. As a result, the recombination zone may be pushed toward the Bphen/TCTA interface. Subsequently, holes are injected into the $C_{60}$ layer through the Bphen layer under a high electric field due to the high $V_{DS}$.

To confirm the hole leakage into the $C_{60}$ layer, we should note that, unlike the low dark current of 10$^{-3}$ mA/cm$^2$ in the phototransistor, the LEPT device in accordance with an exemplary embodiment, may have a dark current of 11.6 mA/cm$^2$ at $V_{GS}$=0 V and $V_{DS}$=15 V and the origin of this leakage current may be due to injection of holes through a low barrier of 0.5 eV at the Bphen/TCTA interface under high fields. Since $C_{60}$ is a well-known luminance quencher, the excitons formed near the $C_{60}$/Bphen interface are quenched, resulting in the extremely low e-to-p conversion efficiency of the LEPT. The 1 µm thickness of the $C_{60}$ layer was chosen to suppress the formation of any possible short current paths in the channel layer during the colloidal lithography process to fabricate the porous ITO source electrode. Given the 20% of the e-to-p conversion efficiency in the previous up-conversion devices, optimization of the electron transporting layer of a LEPT could enhance the p-to-p conversion efficiency by 2,000 times.

The LEPT exhibits a similar dynamic range as the phototransistor. FIG. 4(c) shows the up-conversion luminance, p-to-p conversion efficiency, as well as luminance $\Delta V_{th}$ (red filled) as a function of the IR power density at $V_{DS}$=15 V, $V_{GS}$=10 V. As observed, the threshold voltage shift shows a linear response to the IR power density up to 2.4 µW/cm$^2$ and then saturates, which is similar to that of the phototransistor. Since the LEPT has a high sensitivity at low IR power densities, the p-to-p conversion efficiency reaches 2,700% at an IR power density of 0.53 µW/cm$^2$.

By incorporating a phosphorescent OLED in the phototransistor, we demonstrated an infrared-to-visible up-conversion LEPT with an EQE over 1,000%. With a high sensitivity and speed, the LEPT might lay the foundation for an emerging new class of opto-electronic devices.

Manufacturing Techniques

Following below are illustrative manufacturing techniques for a LEPT device as described above. It will be appreciated that these techniques are provided merely as examples and are non-limiting with respect to both the LEPT device and methods of manufacture of a LEPT.

1. Synthesis of ZnO Nanocrystals and PbS Nanocrystals

ZnO Nanocrystal Synthesis and Spin-Coating Procedure:

0.6585 g of zinc acetate dihydrate (ZnAc, 98+%, ACROS organics) and 30 ml of dimethyl sulfoxide (Fisher Scientific) were stirred together in a flask at a speed of 475 rpm under room temperature. In another flask, 0.6 g of tetramethylammonium hydroxide (>97%, Sigma Aldrich) and 30 ml of ethyl alcohol were mixed by shaking for 2 minutes. Then, the solvents in both flasks were put together and stirred at a speed of 625 rpm for 50 minutes. Next, the solvents were divided into six centrifuge tubes by amount of 10 ml. 20 ml of ethyl acetate and 20 ml of heptane were added to each tube which was then centrifuged at a speed of 7000 rpm under 20° C. for 6 minutes. Following the centrifuging process, the supernatant solvent was removed and 6 ml of ethanol was added to each tube to make a ZnO precursor solution. Then, the ZnO solution was diluted by adding ethanol with 2:3 solution-to-ethanol volume ratio. The diluted ZnO solution was spin-coated on ITO substrate at a speed of 2000 rpm for 1 sec (1st step), 4000 rpm for 1 sec (2nd step), and 5000 rpm for 40 sec (3rd step). Immediately after the spin-coating, the substrate was put on a hot plate for a heat treatment at 80° C. for 10 minutes. Finally, UV curing ($\lambda$=365 nm) was applied for 30 sec in a glove box with oxygen and moisture concentration below 1 ppm.

PbS Nanocrystal Synthesis and Spin-Coating Procedure:

0.7 g of lead(II) oxide (99.999%, metal basis, Puratronic), 50 ml of 1-octadecene (90%, Sigma Aldrich), and 4 ml of oleic acid (90%, Sigma Aldrich) were put into a 100 ml 3-neck flask and stirred on a hot plate until the temperature reached 110° C. One neck of the flask was connected to a condenser to allow Ar gas flow into the flask, and the other was connected to a thermocouple to monitor the temperature, while the middle neck was capped with a rubber. When the temperature reached 110° C., 10 ml of 1-octadecene and 360 µl of hexamethyldisilathiane (synthesis grade, Sigma Aldrich) were mixed and poured into the flask. After 4 minutes, the solvents in the flask were quenched into a beaker containing 150 ml of isopropanol.

The solvents were divided into six centrifuge tubes by amount of 35 ml and then centrifuged at a speed of 7000 rpm under 25° C. for 20 minutes. After pouring the supernatant solution, 7.5 ml of toluene was added to each tube and the tube was shook by vortex. After pouring acetone to make each tube the same weight and the volume of 37.5 ml, 2nd centrifuge step was applied at a speed of 7000 rpm under 25° C. for 5 minutes. After pouring the supernatant solution, 7.5 ml of toluene was added to each tube and the tube was shook by vortex. Next, methanol was poured in each tube to make the same weight and volume of 35 ml, and 3rd centrifuge step was applied at a speed of 11,000 rpm under 25° C. for 10 minutes. After pouring the supernatant solution, all tubes were dried in a vacuum chamber for 2 hours. Then, 3 ml of chloroform was added to each tube and all tubes were dried again in a vacuum chamber overnight.

30 mg/ml of the PbS precursor powder in chloroform was prepared and the solution was spin coated on ZnO/ITO substrate at a speed of 2,000 rpm for 1 sec ($1^{st}$ step) and 2,500 rpm for 10 sec ($2^{nd}$ step). Next, 22.4 µl of benzene-1,3-dithiol (BDT) mixed with 20 ml of Acetonitrile was dropped on the PbS film with a wait time for 10 sec to exchange the oleic acid ligand with the BDT ligand. Immediately after the 10 sec, the same spin-coating steps as explained in the PbS spin-coating process was applied. Finally, Acetonitrile was spin-coated with the same spin-coating steps as explained in the PbS spin-coating process to clean the un-exchanged ligands on the surface. Counting all above processes as '1 layer' coating, we applied 1~5 layer coating of PbS film.

2. Fabrication of Porous ITO Electrode

Poly-Styrene Monolayer Formation:

1 ml of poly-styrene particle suspension (1.1 µm mean size, LB11, Sigma Aldrich) was mixed with 10 ml of deionized water and the solution was centrifuged at a speed of 8,000 rpm under 20° C. for 20 minutes. After pouring the supernatant water, 10 ml of ethanol was added and the solution was centrifuged with the above condition. After pouring the supernatant ethanol, 4 ml of ethylene glycol was added and stirred by a rod ultra-sonicator.

Next, $HfO_2$/PbS/ZnO/ITO substrate was dipped in a full water beaker. Then, the polystyrene-ethylene glycol precursor solution was dropped by a pipette on top of the water to make the water surface covered by a monolayer of polystyrene spheres. Using a syringe pump (KDS200, KD Scientific), the substrate was slowly pulled up at a speed of 400 µl/min while pushing the polystyrene monolayer toward the substrate by dropping sodium dodecyl sulfate (Sigma Aldrich) on the water surface.

Figure 5:
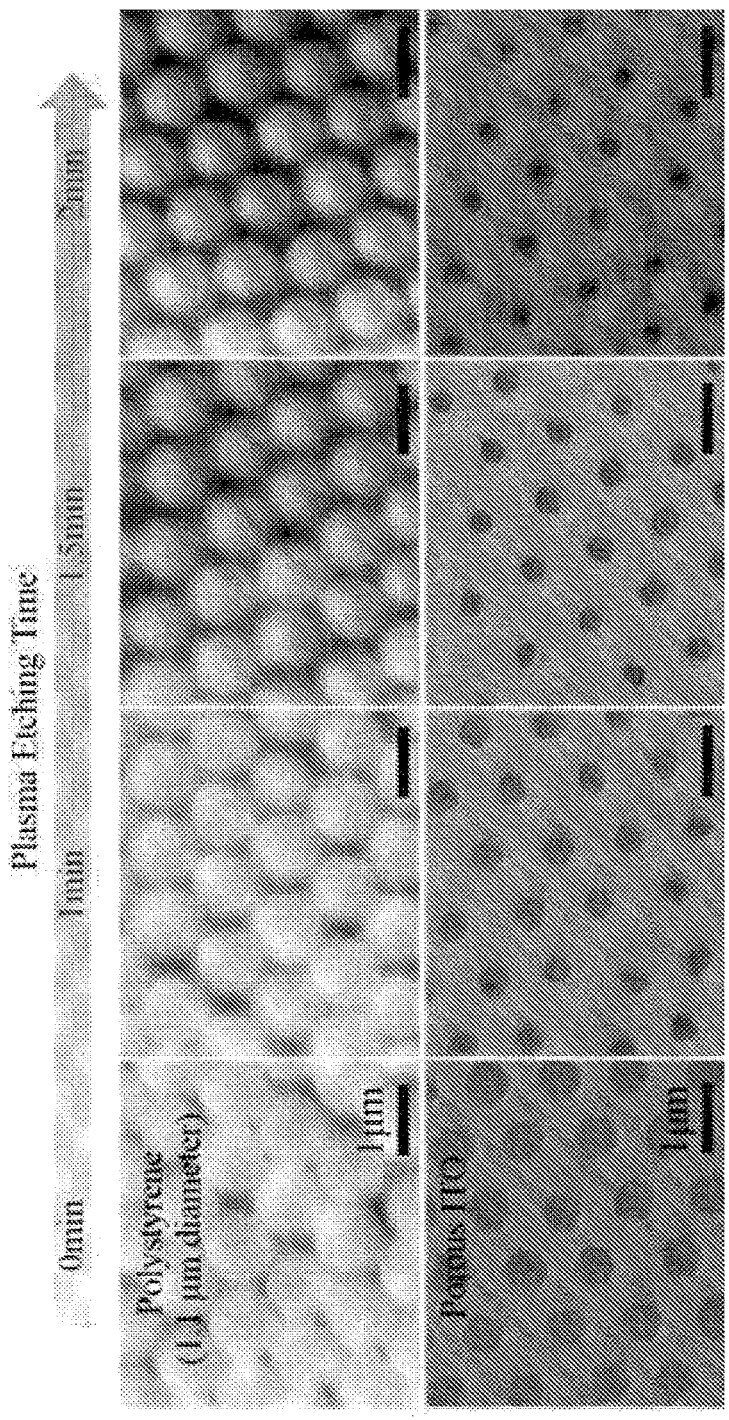
FIG. 5 illustrates pore size control by oxygen plasma etching time, according to some embodiments.

FIG. 5 illustrates pore size control by oxygen plasma. After a monolayer formation on the substrate, the polystyrene particle size was controlled by a reactive ion etching (Unaxis, RIE power=100 W, $O_2$ pressure=40 mTorr, chamber pressure=40 mTorr) for 0~2 minutes. Polystyrene size is important because it will become the ITO pore size at the end. For optimum condition, 1 or 2 minutes of RIE etching time was applied.

Porous ITO Fabrication:

After controlling the polystyrene size by RIE process, the substrate was moved into a sputter chamber. 45 nm-thick ITO film was sputtered on the substrate at a deposition rate of 1 Å/s under 50 sccm of Ar flow and 7 sccm of $O_2$ flow at 150 W of DC sputter power. While in the sputter process, a shadow metal mask was used to define the porous ITO pattern. After the sputtering process, the polystyrene monolayer on the substrate was removed by tape leaving a porous ITO pattern solely on the substrate as shown in FIG. 5.

3. Device Fabrication

Fabrication of Vertical Infrared Phototransistors:

Patterned ITO glass was cleaned using acetone and isopropanol in ultrasonic bath for 15 min respectively, followed by a UV-ozone treatment for 30 minutes. Solution-processed ZnO nanocrystal film was spin-coated in the air on top of the ITO glass substrate followed by a heat treatment at 80° C. for 15 minutes. PbS quantum-dot nanocrystals were synthesized with a peak absorption wavelength lying at 1,046 nm by treating 1,3-benezendithiol (BDT) as the surface ligands during the spin-coating process as explained in the previous section. For an optimum thickness, spin coating of PbS film was performed four times to give 240 nm PbS film thickness. Next, 50 nm-thick $HfO_2$ gate dielectric was deposited on top of the PbS layer by atomic layer deposition (Cambridge Nano Fiji 200, chamber temperature=80° C., deposition rate=1 Å per cycle, # of cycles=500). After a porous ITO source electrode was fabricated as explained in the previous section, the porous ITO/$HfO_2$/PbS/ZnO/ITO sample was UV-ozone-treated for 30 minutes to increase the work-function of the porous ITO electrode. Following the UV treatment, the sample was moved into a thermal evaporating chamber (Kurt J. Lesker company) and 1 µm-thick $C_{60}$ channel layer (99.5%, M.E.R corporation) was deposited in order to avoid any current short path in the $C_{60}$ channel. For the top drain electrode, 100 nm-thick Al film was deposited.

Fabrication of LEPT:

To fabricate a LEPT, an inverted phosphorescent OLED was incorporated in the vertical phototransistor channel. Following the $C_{60}$ channel deposition in the previous section, the whole device ($C_{60}$/porous ITO/$HfO_2$/PbS/ZnO/ITO/glass) was moved to another evaporating chamber without an air exposure for the inverted OLED deposition. 50 nm-thick 4,7-diphenyl-1,10-phenanthroline (Bphen), as an electron-transporting layer, was deposited on top of the $C_{60}$ layer at a deposition rate of 1 Å/s. Next, 20 nm-thick 4,48,49-tri(N-carbazolyl) triphenylamine (TCTA), as a host material, was deposited at 1 Å/s doped with 9% fac tris(2-phenylpyridine)iridium [$Ir(ppy)_3$]. For a hole-transporting layer, 100 nm-thick 4,4'-bis[N-(1-napthyl)-N-phenyl-amino]biphenyl (NPB) was deposited at 1 Å/s, finished by MoOx (5 nm) and Al (100 nm) deposition.

Device Characterization:

Electrical characteristics were measured using Keithley 4200. For luminance-current-voltage (LIV) characteristics, a calibrated Si photodiode (Newport, Responsivity=0.34 A/W at 550 nm wavelength) connected to the Keithley 4200 was used to measure the photocurrent. A 150 W ozone free xenon DC arc lamp coupled with an ORIEL 74125 monochromator was used to generate a monochromatic infrared light. The IR intensity was controlled by using a neutral density filters and a diffuser. All devices were encapsulated in a glove box with both $0_2$ and moisture levels below 1 ppm, and the measurements were performed at room temperature under ambient atmosphere.

4. IR Power Dependence of Vertical Phototransistor

FIG. 6 illustrates the power dependence of a vertical phototransistor. Transfer curves with different IR power density from 0.88 µW/cm² to 81.2 µW/cm² are plotted in FIG. 6 (left). In order to maximize the EQE, high $V_{DS}$ (=13V) was applied. In FIG. 6, illustrative curves A, B, C, and D are labeled corresponding to no photocurrent (dark), 0.88 µW/cm², 1.05 µW/cm², and 81.2 µW/cm², respectively.

5. Effect of PbS Thickness

FIG. 7 depicts the effect of PbS thickness on device operation window. PbS thickness was controlled by the number of PbS spin-coating process. As observed, thicker PbS film may demand a higher gate voltage to turn on the dark transfer curve. In addition, IR absorption in the thicker PbS film is larger than the absorption in thinner PbS film, leading to larger threshold voltage shift under IR illumination. As a result, wider device operation window was observed in the device with 240 nm-thick PbS layer.

6. Effect of Source-Drain Voltage ($V_{DS}$)

FIG. 8 illustrates the effect of $V_{DS}$ on EQE. Effect of $V_{DS}$ (3 V, 6 V, 10 V, and 13 V) on EQE was examined. Relatively stronger IR power density (157 µW/cm$^2$) was applied to demonstrate the big change in EQE as function of $V_{DS}$.

7. IR Power Dependence of Up-Conversion Transistor

In some embodiments, when operated with a source-drain voltage of 15V, a LEPT device as described herein may have a luminance between 1 cd/m$^2$ and 500 cd/m$^2$ for gate-source voltages between 7.5V and 12V.

In some embodiments, when operated with a source-drain voltage of 15V, a LEPT device as described herein may have a photon-to-photon conversion efficiency between 0.1% and 10,000% for gate-source voltages between 7.5V and 12V.

8. Reproducibility of Vertical Phototransistor

Figure 9:
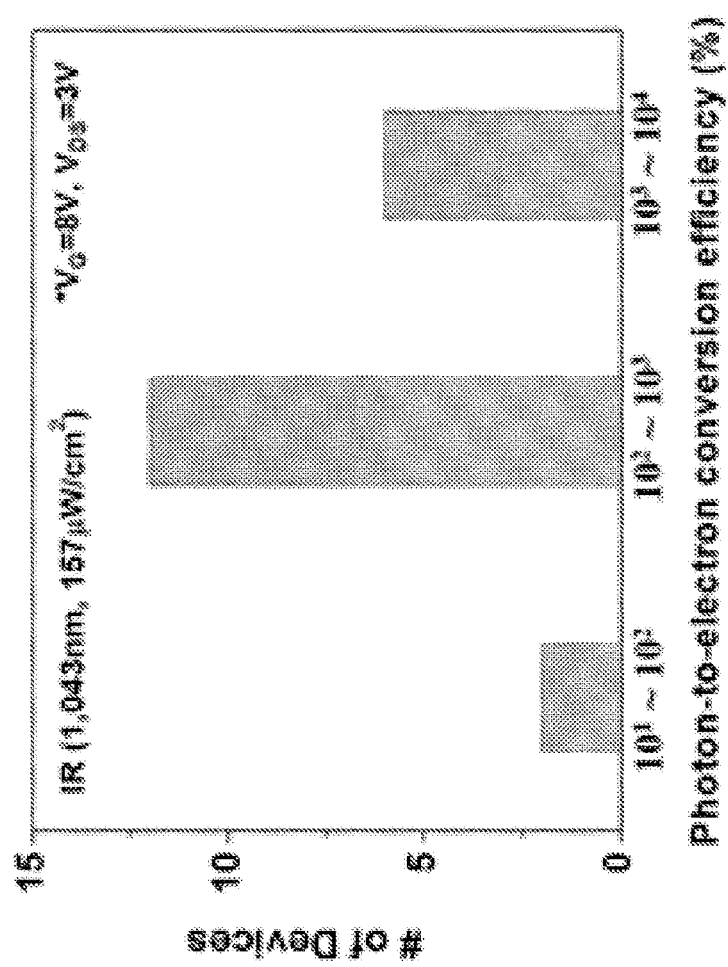
FIG. 9 illustrates reproducibility of the vertical phototransistor, according to some embodiments.

FIG. 9 illustrates reproducibility of the vertical phototransistor. 20 IR phototransistor devices were fabricated in the exactly same condition, and the EQEs were measured at $V_{GS}$=8V and $V_{DS}$=3V for each device. Strong IR power density (157 µW/cm$^2$) was applied in the measurement, and 18 out of 20 devices exhibited gain EQEs.

9. Detectivity Measurement of the Vertical Phototransistor

Detectivity, D*, is expressed by the following equation (1).

$$D^* = (A\Delta f)^{1/2} R/i_n \quad (1)$$

where A is the device area, Δf is bandwidth in Hz, R is responsivity in A/W, $i_n$ is the noise current in ampere. R is expressed by $$R = EQE \times \left(\frac{q}{h\nu}\right) \quad (2)$$

where q is the electronic charge, h is the Planck constant, and ν is the frequency of the incident photon. The noise current was measured under electrically and optically shielded environment using a Stanford Research SR830 lock-in amplifier and a SR570 low noise preamplifier (2). The lock-in frequency of the noise current was set to be 30 Hz during the measurements. For a voltage supply, alkaline batteries were used to minimize a noise. For a vertical phototransistor employing 240 nm-thick PbS film, we observed a high detectivity of 1.23×10$^{13}$ jones at $V_{GS}$=3.5V and $V_{DS}$=13V, which is comparable with the detectivity of a commercial InGaAs photodiode (3).

10. RC Measurement of the Phototransistor

Figure 10:
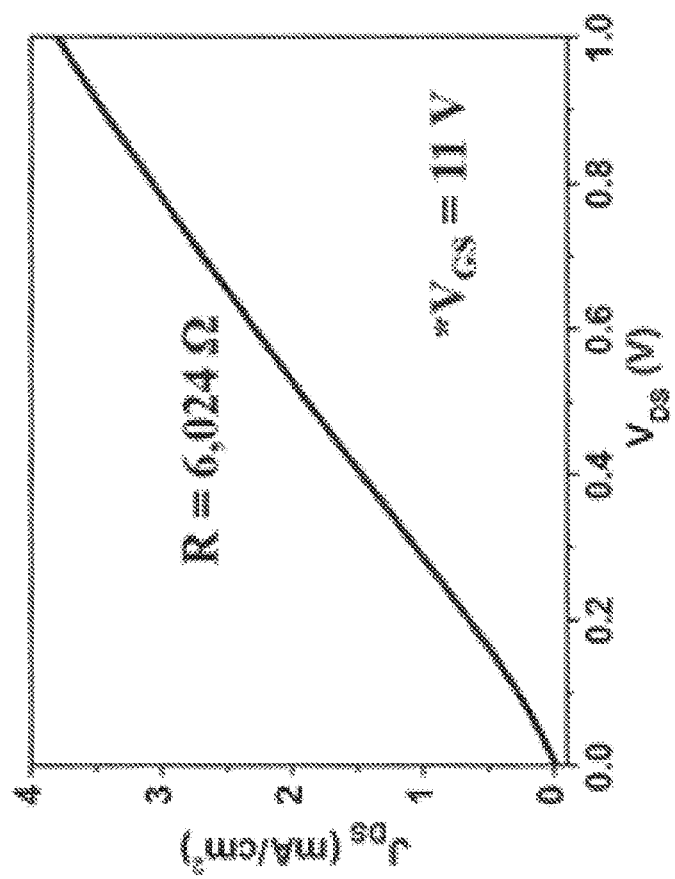
FIG. 10 illustrates source-drain current of a vertical IR phototransistor as a function of source-drain bias, according to some embodiments.

FIG. 10 illustrates an example of source-drain current of a vertical IR phototransistor as a function of source-drain bias. The resistance of the $C_{60}$ layer in the vertical IR phototransistor was measured at $V_{GS}$=11 V with sweeping $V_{DS}$ at low voltages. Due to the high $V_{GS}$ and low $V_{DS}$, the source-drain current follows Ohm's law enabling calculation of the resistance of the $C_{60}$ layer to be 6,024Ω. If the resistance is calculated from the universal resistivity of $C_{60}$ (1,014 Ω/m), the resistance should be 250Ω which is almost 24 times lower than the measured resistivity of the $C_{60}$ layer in our phototransistor. The huge difference in the resistance attributes to the contact resistance at the top Al drain electrode. Since the total capacitance of the phototransistor was measured to be 1.6 nF at $V_{DS}$=7 V and $V_{GS}$=6 V, the calculated RC constant from the RC measurement was 9.6 µs corresponding to a cut-off frequency of 17 kHz.

REFERENCES

The following references are incorporated herein by reference in their entireties:

Chen, J. et al. Hybrid Organic/Inorganic Optical Up-Converter for Pixel-Less Near-Infrared Imaging. Adv Mater 24, 3138-3142 (2012).

Allard, L., Liu, H., Buchanan, M. & Wasilewski, Z. Pixelless infrared imaging utilizing a p-type quantum well infrared photodetector integrated with a light emitting diode. Appl Phys Lett 70, 2784-2786 (1997).

Kim, D. Y., Song, D. W., Chopra, N., De Somer, P. & So, F. Organic Infrared Upconversion Device. Adv Mater 22, 2260 (2010).

Kim, D. Y. et al. PbSe Nanocrystal-Based Infrared-to-Visible Up-Conversion Device. Nano Lett 11, 2109-2113 (2011).

Kim, D. Y. Lai, T.-H., Lee, J. W., Manders, J. R. & So, F. Multi-spectral imaging with infrared sensitive organic light emitting diode. Scientific reports 4 (2014).

Campbell, I. H. & Crone, B. K. A near infrared organic photodiode with gain at low bias voltage. Appl Phys Lett 95, 263302-263302-263303 (2009).

Sun, Z. et al. Infrared Photodetectors Based on CVD-Grown Graphene and PbS Quantum Dots with Ultrahigh Responsivity. Adv Mater 24, 5878-5883 (2012).

Konstantatos, G. et al. Ultrasensitive solution-cast quantum dot photodetectors. Nature 442, 180-183 (2006).

Konstantatos, G. et al. Hybrid graphene-quantum dot phototransistors with ultrahigh gain. Nat Nanotechnol 7, 363-368 (2012).

Peumans, P. & Forrest, S. R. Very-high-efficiency double-heterostructure copper phthalocyanine/C-60 photovoltaic cells. Appl Phys Lett 79, 126-128 (2001).

Luo, H., Ban, D., Liu, H. C., Wasilewski, Z. R. & Buchanan, M. Optical upconverter with integrated heterojunction phototransistor and light-emitting diode. Appl Phys Lett 88 (2006).

G. He, M. Pfeiffer, K. Leo, M. Hofmann, J. Birnstock, R. Pudzich, J. Salbeck, High-efficiency and low-voltage p-i-n electrophosphorescent organic light-emitting diodes with double-emission layers. Appl Phys Lett 85, 3911-3913 (2004).

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The invention claimed is:

1. A photonic conversion device, comprising:
a photoactive layer;
a porous conductor layer;
a dielectric layer between the photoactive layer and the porous conductor layer;
an electron transport layer in contact with the porous conductor layer; and
a light emitting device in contact with the electron transport layer.

2. The photonic conversion device of claim 1, further comprising a first electrode in contact with the light emitting device and a second electrode in contact with the photoactive layer, wherein the first electrode and second electrode are each electrically connected to the porous conductor layer through a respective bias voltage source.

3. The photonic conversion device of claim 1, wherein the porous conductor layer is transparent.

4. The photonic conversion device of claim 1, wherein the porous conductor layer includes a plurality of holes extending through the porous conductor layer.

5. The photonic conversion device of claim 4, wherein the transparent conductor is indium tin oxide (ITO).

6. The photonic conversion device of claim 4, wherein the plurality of holes each have a diameter between 0.1 μm and 10 μm.

7. The photonic conversion device of claim 1, wherein the electron transport layer comprises fullerene.

8. The photonic conversion device of claim 1, wherein infrared photons incident on the photoactive layer cause emission of visible light photons from the light emitting device.

9. The photonic conversion device of claim 1, wherein the light emitting device is an organic light emitting device (OLED).

10. The photonic conversion device of claim 1, wherein the photoactive layer comprises one or more of: lead sulfide, silver sulfide and silver selenide.

11. The photonic conversion device of claim 1, wherein the photoactive layer comprises nanocrystals.

12. The photonic conversion device of claim 1, wherein the dielectric layer comprises a high-κ dielectric.

13. The photonic conversion device of claim 12, wherein the dielectric layer comprises hafnium oxide.

14. The photonic conversion device of claim 1, wherein a work function of the electron transport layer is higher than a work function of the porous conductor layer.

15. The photonic conversion device of claim 1, further comprising a hole blocking layer between the photoactive layer and an electrode, the electrode electrically connected to the porous conductor layer.

16. The photonic conversion device of claim 15, wherein the hole blocking layer comprises one or more of: titanium dioxide, zinc oxide and zinc sulfide.

17. The photonic conversion device of claim 15, wherein the hole blocking layer comprises nanocrystals.

18. A method of operating a photonic conversion device comprising a photoactive layer, a porous conductor layer, an electron transport layer in contact with the porous conductor layer, and a light emitting device in contact with the electron transport layer, the method comprising:
applying a first bias voltage from the porous conductor layer across the photoactive layer;
applying a second bias voltage from the porous conductor layer across the electron transport layer and the light emitting device, the second bias voltage having a sign opposite to a sign of the first bias voltage,
wherein infrared photons incident on the photoactive layer produce visible photons from the light emitting device with a conversion efficiency exceeding 1000%.

19. The method of claim 18, wherein the first bias voltage is further applied across a dielectric layer between the photoactive layer and the porous conductor layer.

20. The method of claim 18, wherein the first bias voltage is applied between a first electrode and the porous conductor layer.

21. The method of claim 20, wherein the second bias voltage is further applied across a hole blocking layer between the photoactive layer and the first electrode.

22. The method of claim 18, wherein the second bias voltage is applied between a second electrode and the porous conductor layer, and wherein the visible photons produced from the light emitting device are output from the photonic conversion device via the second electrode.

23. The method of claim 18, wherein the porous conductor layer is transparent.

24. The method of claim 18, further comprising directing the infrared photons onto the photonic conversion device.

25. The method of claim 24, wherein the infrared photons are directed onto a transparent electrode.

* * * * *